United States Patent
Wakabayashi

(10) Patent No.: US 12,334,244 B2
(45) Date of Patent: *Jun. 17, 2025

(54) ELECTRONIC COMPONENT

(71) Applicant: TAIYO YUDEN CO., LTD., Tokyo (JP)

(72) Inventor: Hirotaka Wakabayashi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/502,766

(22) Filed: Nov. 6, 2023

(65) Prior Publication Data

US 2024/0079175 A1 Mar. 7, 2024

Related U.S. Application Data

(63) Continuation of application No. 17/127,184, filed on Dec. 18, 2020, now Pat. No. 11,848,144.

(30) Foreign Application Priority Data

Dec. 27, 2019 (JP) ................. 2019-238929

(51) Int. Cl.
*H01F 27/28* (2006.01)
*H01F 1/33* (2006.01)
(Continued)

(52) U.S. Cl.
CPC ........... *H01F 27/2804* (2013.01); *H01F 1/33* (2013.01); *H01F 27/32* (2013.01); *H05K 1/162* (2013.01);
(Continued)

(58) Field of Classification Search
CPC ........ H01F 27/2804; H01F 1/33; H01F 27/32; H01F 2027/2809
(Continued)

(56) References Cited

U.S. PATENT DOCUMENTS

| 6,373,368 B1 | 4/2002 | Shikama |
| 6,479,763 B1 * | 11/2002 | Igaki ............... C08J 9/0066 |
| | | 428/313.5 |

(Continued)

FOREIGN PATENT DOCUMENTS

| CN | 112582157 A | 3/2021 |
| EP | 1076346 A1 | 2/2001 |

(Continued)

OTHER PUBLICATIONS

Notice of Reasons for Refusal dated Aug. 29, 2023, issued in corresponding Japanese Patent Application No. 2019-238929, with English translation (10 pgs.).

(Continued)

*Primary Examiner* — Shawki S Ismail
*Assistant Examiner* — Joselito S. Baisa
(74) *Attorney, Agent, or Firm* — Pillsbury Winthrop Shaw Pittman, LLP

(57) ABSTRACT

One object of the present invention is to provide an electronic component less prone to migration of impurity atoms between a conductor and an external electrode. A coil component as an electronic component includes: a base body; a conductor; a first external electrode electrically connected to the conductor; a second external electrode electrically connected to the conductor; and a metal film positioned between the conductor and the first external electrode, wherein the metal film contains metal particles configured such that an average of $\beta/\alpha$ is 0.8 to 1.2, where for each of the metal particles, $\alpha$ is a dimension of the metal particle in a direction horizontal to a boundary interface, and $\beta$ is a dimension of the metal particle in a direction perpendicular to the boundary interface.

18 Claims, 12 Drawing Sheets

(51) Int. Cl.
*H01F 27/32* (2006.01)
*H05K 1/16* (2006.01)

(52) U.S. Cl.
CPC ..... *H05K 1/165* (2013.01); *H01F 2027/2809* (2013.01)

(58) Field of Classification Search
USPC .................................................. 336/199, 200
See application file for complete search history.

(56) References Cited

U.S. PATENT DOCUMENTS

| | | | | |
|---|---|---|---|---|
| 9,490,055 | B2* | 11/2016 | Zenzai | H01G 4/008 |
| 11,189,424 | B2 | 11/2021 | Kim | |
| 11,437,182 | B2* | 9/2022 | Yamaguchi | H01F 27/292 |
| 2008/0210564 | A1* | 9/2008 | Motoki | H10N 30/50 |
| | | | | 205/122 |
| 2009/0161293 | A1* | 6/2009 | Takeuchi | H01G 4/005 |
| | | | | 361/321.2 |
| 2014/0268485 | A1* | 9/2014 | Kang | H01B 1/22 |
| | | | | 252/512 |
| 2016/0027583 | A1* | 1/2016 | Ahn | H01G 4/12 |
| | | | | 361/301.4 |
| 2016/0035476 | A1 | 2/2016 | Mimura et al. | |
| 2017/0301458 | A1 | 10/2017 | Mimura et al. | |
| 2019/0122809 | A1 | 4/2019 | Mimura et al. | |
| 2019/0244742 | A1 | 8/2019 | Song et al. | |
| 2019/0252123 | A1 | 8/2019 | Kim | |
| 2020/0185153 | A1 | 6/2020 | Yun | |
| 2020/0365314 | A1 | 11/2020 | Mimura et al. | |
| 2021/0082623 | A1* | 3/2021 | Kim | H01G 4/224 |
| 2021/0098186 | A1 | 4/2021 | Wakabayashi | |
| 2021/0375549 | A1 | 12/2021 | Okada | |
| 2022/0068564 | A1 | 3/2022 | Shinozaki | |
| 2023/0215639 | A1 | 7/2023 | Lee | |
| 2024/0194408 | A1* | 6/2024 | Yun | H01G 4/008 |

FOREIGN PATENT DOCUMENTS

| | | |
|---|---|---|
| JP | 2005-159064 A | 6/2005 |
| JP | 2016-032050 A | 3/2016 |
| JP | 2019-140371 A | 8/2019 |

OTHER PUBLICATIONS

Notification of First Office Action dated Jan. 18, 2025, issued in corresponding Chinese Patent Application No. 202011524887.6, with English translation (13 pgs.).

* cited by examiner

ELECTRONIC COMPONENT

CROSS-REFERENCE TO RELATED APPLICATIONS

This application is a continuation of U.S. patent application Ser. No. 17/127,184 (filed on Dec. 18, 2020), which claims the benefit of priority from Japanese Patent Application Serial No. 2019-238929 (filed on Dec. 27, 2019), the contents of which are hereby incorporated by reference in their entirety.

TECHNICAL FIELD

The present disclosure relates to an electronic component.

BACKGROUND

An example of a known electronic component is a coil component such as an inductor. A conventional coil component typically includes a magnetic base body made of a magnetic material, a conductor provided in the magnetic base body and wound around a coil axis, and an external electrode connected to an end portion of the conductor. Such a coil component is mounted on a substrate, for example, through electric connection between the external electrode and the substrate soldered to each other, for use as a component of various electronic devices. An example of the conventional coil component is disclosed in Japanese Patent Application Publication No. 2019-140371.

Between the conductor and the external electrode of the electronic component, migration of impurity atoms contained in the solder or the like may occur due to heat or voltage application. Once the migration occurs, the impurity atoms are alloyed with the materials contained in the conductor or the external electrode, thereby forming voids in the conductor and/or the external electrode. As a result, the joint strength between the conductor and the external electrode is unfavorably reduced.

SUMMARY

One object of the present invention is to provide an electronic component less prone to migration of impurity atoms between the conductor and the external electrode. Other objects of the present invention will be made apparent through the entire description in the specification.

An electronic component according to one embodiment of the present invention comprises: a base body; a conductor provided inside or outside the base body; a first external electrode electrically connected to the conductor; a second external electrode electrically connected to the conductor; and a metal film positioned between the conductor and the first external electrode, wherein the metal film contains metal particles configured such that an average of $\beta/\alpha$ is 0.8 to 1.2, where for each of the metal particles, $\alpha$ is a dimension of the metal particle in a direction horizontal to a boundary interface between the conductor and the metal film, and $\beta$ is a dimension of the metal particle in a direction perpendicular to the boundary interface.

In one embodiment of the present invention, at least a part of the conductor and at least a part of the metal film may be connected with each other by metallic bond.

In one embodiment of the present invention, the electronic component may further comprise an oxide film positioned between the conductor and the metal film, wherein the oxide film may have a thickness of 200 nm or smaller.

In one embodiment of the present invention, in a direction perpendicular to the boundary interface, particle sizes of the metal particles positioned on a conductor side may be smaller than particle sizes of the metal particles positioned on a first external electrode side.

In one embodiment of the present invention, the metal film may be a sputtered film.

In one embodiment of the present invention, a void formed in an interface between the metal particles contained in the metal film may have a size of not more than five atoms included in the metal particles.

In one embodiment of the present invention, the metal film may contain Cu, Ag, or an alloy including at least one of Cu and Ag.

In one embodiment of the present invention, the electronic component may further comprise another metal film positioned between the conductor and the second external electrode, wherein the other metal film may contain metal particles configured such that an average of $\beta/\alpha$ is 0.8 to 1.2, where for each of the metal particles, $\alpha$ is a dimension of the metal particle in a direction horizontal to another boundary interface between the conductor and the other metal film, and $\beta$ is a dimension of the metal particle in a direction perpendicular to the other boundary interface.

In one embodiment of the present invention, at least a part of the conductor and at least a part of the other metal film may be connected with each other by metallic bond.

In one embodiment of the present invention, the electronic component may further comprise another oxide film positioned between the conductor and the other metal film, wherein the other oxide film may have a thickness of 200 nm or smaller.

In one embodiment of the present invention, in a direction perpendicular to the other boundary interface, particle sizes of the metal particles positioned on a conductor side may be smaller than particle sizes of the metal particles positioned on a second external electrode side.

In one embodiment of the present invention, the other metal film may be a sputtered film.

In one embodiment of the present invention, a void formed in an interface between the metal particles contained in the other metal film may have a size of not more than five atoms included in the metal particles.

In one embodiment of the present invention, the other metal film may contain Cu, Ag, or an alloy including at least one of Cu and Ag.

In one embodiment of the present invention, an ionization tendency of a main ingredient of a metal contained in the first external electrode and the second external electrode may be smaller than that of a main ingredient of a metal contained in the conductor.

In one embodiment of the present invention, the conductor may include a portion wound around a coil axis.

One embodiment of the present invention relates to a circuit board comprising any one of the above electronic components. One embodiment of the present invention relates to an electronic device comprising the above circuit board.

Advantageous Effects

The present invention is an electronic component less prone to migration of impurity atoms between the conductor and the external electrode.

DESCRIPTION OF THE EMBODIMENTS

Various embodiments of the present invention will be hereinafter described with reference to the accompanying drawings. The constituents common to more than one drawing are denoted by the same reference signs throughout the drawings. For convenience of explanation, the drawings do not necessarily appear to scale.

Figure 1:
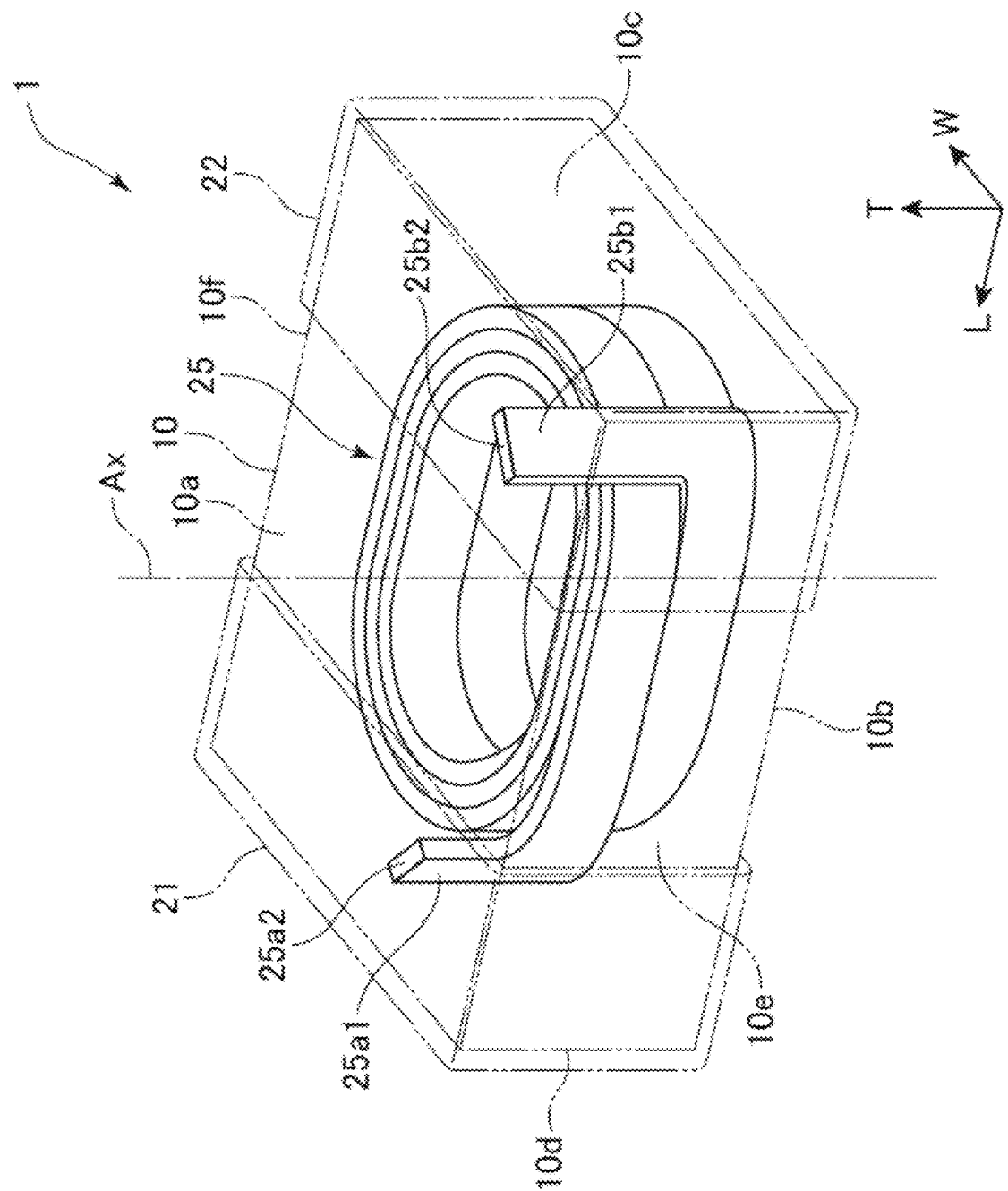
FIG. 1 is a perspective view schematically showing a coil component as an electronic component according to one embodiment of the present invention.

A coil component 1 as an electronic component according to one embodiment of the present invention will be hereinafter outlined with reference to FIG. 1. FIG. 1 is a perspective view schematically showing the coil component 1. As shown in FIG. 1, the coil component 1 includes a base body 10, a coil conductor 25 provided in the base body 10, an external electrode (first external electrode) 21 disposed on a surface of the base body 10, and an external electrode (second external electrode) 22 disposed on the surface of the base body 10 at a position spaced apart from the external electrode 21.

In this specification, a "length" direction, a "width" direction, and a "thickness" direction of the coil component 1 correspond to the "L axis" direction, the "W axis" direction, and the "T axis" direction in FIG. 1, respectively, unless otherwise construed from the context. The "thickness" direction is also referred to as the "height" direction.

The coil component 1 is mounted on a circuit board (not shown). The circuit board has two land portions provided thereon. The coil component 1 is mounted on the circuit board by bonding the external electrodes 21, 22 to the land portions corresponding to the external electrodes 21, 22, respectively. The circuit board can be installed in electronic devices such as smartphones, tablets, game consoles, and various others. The circuit board may also be installed in an electric component of an automobile, which is a sort of electronic device.

The coil component 1 may be applied to inductors, transformers, filters, reactors, and various other coil components. The coil component 1 may also be applied to coupled inductors, choke coils, and various other magnetically coupled coil components. Applications of the coil component 1 are not limited to those explicitly described herein.

The base body 10 is made of an insulating material. In one embodiment, the base body 10 is made mainly of a magnetic material and formed in a rectangular parallelepiped shape. In the coil component 1 according to one embodiment of the invention, the base body 10 has a length (the dimension in the L axis direction) of 1.0 mm to 4.5 mm, a width (the dimension in the W axis direction) of 0.5 mm to 3.2 mm, and a height (the dimension in the T axis direction) of 0.5 mm to 5.0 mm. The dimensions of the base body 10 are not limited to those specified herein. The term "rectangular parallelepiped" or "rectangular parallelepiped shape" used herein is not intended to mean solely "rectangular parallelepiped" in a mathematically strict sense.

The base body 10 has a first principal surface 10a, a second principal surface 10b, a first end surface 10c, a second end surface 10d, a first side surface 10e, and a second side surface 10f. These six surfaces define the outer periphery of the base body 10. The first principal surface 10a and the second principal surface 10b are at the opposite ends in the height direction, the first end surface 10c and the second end surface 10d are at the opposite ends in the length direction, and the first side surface 10e and the second side surface 10f are at the opposite ends in the width direction.

As shown in FIG. 1, the first principal surface 10a lies on the top side of the base body 10, and therefore, the first principal surface 10a may be herein referred to as "the top surface." Similarly, the second principal surface 10b may be referred to as "the bottom surface." The coil component 1 is disposed such that the first principal surface 10a faces the circuit board, and therefore, the first principal surface 10a may be herein referred to as "the mounting surface." The top-bottom direction of the coil component 1 refers to the top-bottom direction in FIG. 1.

Figure 2:
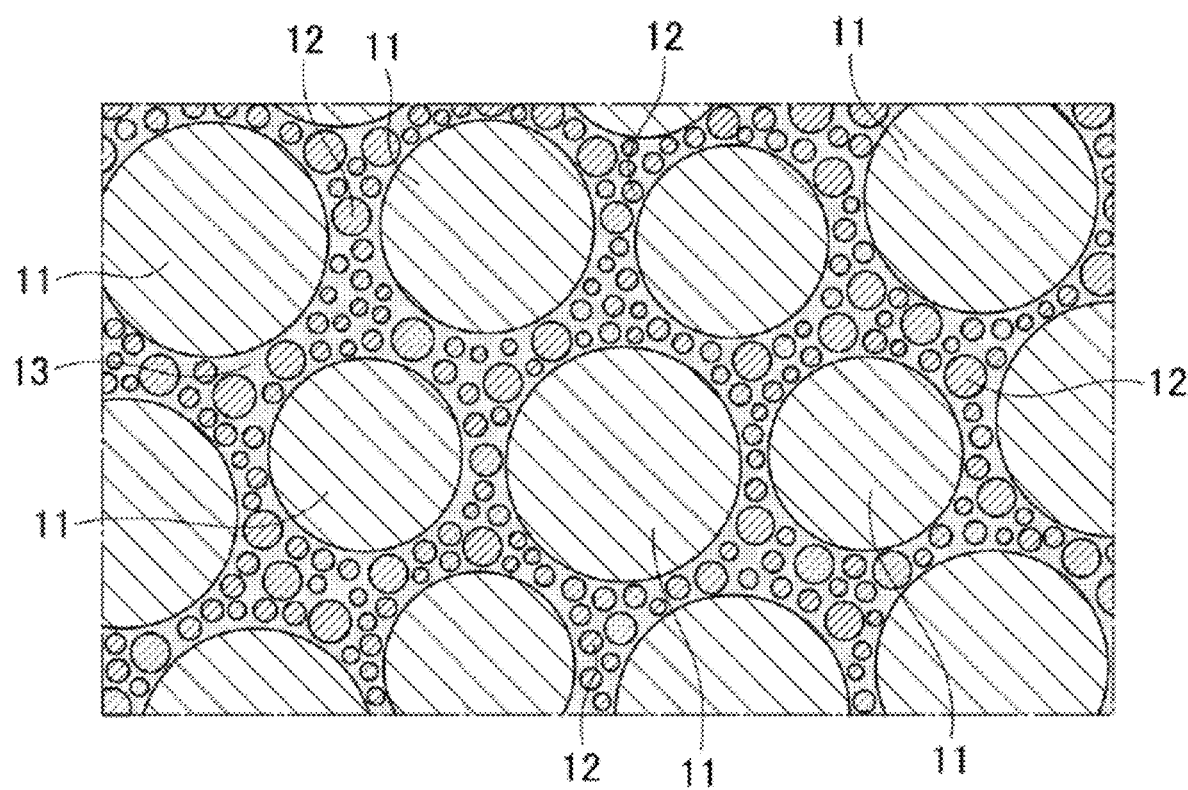
FIG. 2 is an enlarged sectional view schematically showing, on an enlarged scale, a sectional surface of a magnetic base body of the coil component shown in FIG. 1.

Next, the base body 10 which is magnetic will be further described with reference to FIG. 2. FIG. 2 is an enlarged sectional view schematically showing, on an enlarged scale, a sectional surface of the base body 10. As shown in the drawing, the base body 10 includes a plurality of first metal magnetic particles 11, a plurality of second metal magnetic particles 12, and a binder 13. The binder 13 binds together the plurality of first metal magnetic particles 11 and the plurality of second metal magnetic particles 12. In other words, the base body 10 is formed of the binder 13 and the plurality of first metal magnetic particles 11 and the plurality of second metal magnetic particles 12 bound to each other by the binder 13.

The plurality of first metal magnetic particle 11 have a larger average particle size than the plurality of second metal magnetic particles 12. That is, the average particle size of the plurality of first metal magnetic particles 11 (hereinafter referred to as the first average particle size) is different from the average particle size of the plurality of second metal magnetic particles 12 (hereinafter referred to as the second average particle size). For example, the first average particle size is 30 µm, and the second average particle size is 0.1 µm, but these are not limitative. In one embodiment of the present invention, the base body 10 may further contain a plurality of third metal magnetic particles (not shown) having an average particle size different from the first average particle size and the second average particle size (the average particle size of the third metal magnetic particles is hereinafter referred to as the third average particle size). The third average particle size may be smaller than the first average particle size and larger than the second average particle size, or it may be smaller than the second average particle size. The first metal magnetic particles 11, the second metal magnetic particles 12, and the third metal magnetic particles contained in the magnetic base body 10 may be hereinafter collectively referred to as "the metal magnetic particles" when they need not be distinguished from one another.

The first metal magnetic particles 11 and the second metal magnetic particles 12 can be formed of various soft magnetic materials. For example, a main ingredient of the first metal magnetic particles 11 is Fe. Specifically, the first metal magnetic particles 11 are particles of (1) a metal such as Fe or Ni, (2) a crystalline alloy such as an Fe—Si—Cr alloy, an Fe—Si—Al alloy, or an Fe—Ni alloy, (3) an amorphous alloy such as an Fe—Si—Cr—B—C alloy or an Fe—Si—Cr—B alloy, or (4) a mixture thereof. The composition of the metal magnetic particles contained in the magnetic base body 10 is not limited to those described above. The first metal magnetic particles 11 may contain, for example, 85 wt % or more Fe. This provides the magnetic base body 10 with an excellent magnetic permeability. The composition of the second metal magnetic particles 12 is either the same as or different from that of the first metal magnetic particles 11. When the magnetic base body 10 contains the plurality of third metal magnetic particles (not shown), the composition of the third metal magnetic particles is either the same as or different from that of the first metal magnetic particles 11, as with the second metal magnetic particles 12.

The surfaces of the metal magnetic particles may be coated with insulating films (not shown). The insulting films are formed of, for example, a glass, a resin, or other materials having an excellent insulating quality. For example, the insulting films are formed on the surfaces of the first metal magnetic particles 11 by mixing the first metal magnetic particles 11 with powder of a glass material in a friction mixer (not shown). The insulating films formed of the glass material are adhered to the surfaces of the first metal magnetic particles 11 by the compression friction action in the friction mixer. The glass material may contain ZnO and $P_2O_5$. The insulating films may be formed of various glass materials. The insulating film 14 may be formed of alumina powder, zirconia powder, or any other oxide powders having a high insulating property, in place of or in addition to the glass powder. The thickness of the insulating films is, for example, 100 nm or smaller.

The second metal magnetic particles 12 may be coated with different insulating films than the first metal magnetic particles 11. The insulating films may be oxide films formed by oxidation of the second metal magnetic particles 12. The thickness of these insulating films is, for example, 20 nm or smaller. These insulating films may be oxide films formed on the surfaces of the second metal magnetic particles 12 by heat-treating the second metal magnetic particles 12 in the atmosphere. These insulating films may be oxide films containing an oxide of Fe or other elements contained in the second metal magnetic particles 12. These insulating films may be iron phosphate films formed on the surfaces of the second metal magnetic particles 12 by placing the second metal magnetic particles 12 into phosphoric acid and stirring. The insulating films of the first metal magnetic particles 11 may be oxide films formed by oxidation of the first metal magnetic particles 11, whereas the insulating films of the second metal magnetic particles 12 may be coating films formed by a method other than oxidation of the second metal magnetic particles 12.

The binder 13 is, for example, a thermosetting resin having a high insulating property. Examples of the binder 13 include an epoxy resin, a polyimide resin, a polystyrene (PS) resin, a high-density polyethylene (HDPE) resin, a polyoxymethylene (POM) resin, a polycarbonate (PC) resin, a polyvinylidene fluoride (PVDF) resin, a phenolic resin, a polytetrafluoroethylene (PTFE) resin, or a polybenzoxazole (PBO) resin. The binder 13 may also be glass or other materials and may contain an insulating filler.

The conductor 25 is formed in a pattern. In the embodiment shown, the conductor 25 is wound around the coil axis Ax (see FIG. 1). When seen from above, the conductor 25 has, for example, a spiral shape, a meander shape, a linear shape or a combined shape of these.

The conductor 25 is formed by plating with Cu, Ag, or other conductive materials. The entire surface of the conductor 25 other than an end surface 25a2 and an end surface 25b2 may be coated with an insulating film. As shown, when the conductor 25 is wound around the coil axis Ax for a plurality of turns, each of the turns of the conductor 25 may be separated from adjacent turns. In this arrangement, the base body 10 mediates between the adjacent turns.

The conductor 25 includes a lead-out conductor 25a1 at one end portion thereof and a lead-out conductor 25b1 at the other end portion thereof. The lead-out conductor 25a1 has the end surface 25a2 at an end portion thereof, and the lead-out conductor 25b1 has the end surface 25b2 at an end portion thereof. The conductor 25 is electrically connected to the external electrode 21 via the lead-out conductor 25a1 forming one end portion thereof, and the conductor 25 is also electrically connected to the external electrode 22 via the lead-out conductor 25b1 forming the other end portion thereof.

In one embodiment of the present invention, the external electrode 21 extends on a part of the first principal surface 10a, the second principal surface 10b, the second end surface 10c, the first side surface 10e, and the second side surface 10f of the base body 10. The external electrode 22 extends on a part of the first principal surface 10a, the second principal surface 10b, the second end surface 10d, the first side surface 10e, and the second side surface 10f of the base body 10. The external electrodes 21, 22 are spaced apart from each other. Shapes and arrangements of the external electrodes 21, 22 are not limited to those in the example shown. Both the lead-out conductor 25a1 and the lead-out conductor 25b1 lead to the first principal surface (the mounting surface) 10a of the base body 10, and the end surface 25a2 of the lead-out conductor 25a1 and the end surface 25b2 of the lead-out conductor 25b1 are exposed from the base body 10 through the first principal surface 10a. That is, the end surface 25a2 of the lead-out conductor 25a1 and the end surface 25b2 of the lead-out conductor 25b1 are exposed from the base body 10 through the same surface. It is also possible that the end surface 25a2 of the lead-out conductor 25a1 and the end surface 25b2 of the lead-out conductor 25b1 are exposed from the base body 10 through different surfaces.

Each of the external electrodes 21, 22 is either entirely made of a metal or partially made of a non-metal material such as a resin. An example of an external electrode partially made of a non-metal material such as a resin is a conductive resin film. The conductive resin film may have, for example, a plating layer provided on the surface thereof. The plating layer may be composed of, for example, a single plating layer such as a Ni plating layer and a Sn plating layer, or two plating layers including a Ni plating layer and a Sn plating layer formed on the Ni plating layer.

Figure 3:
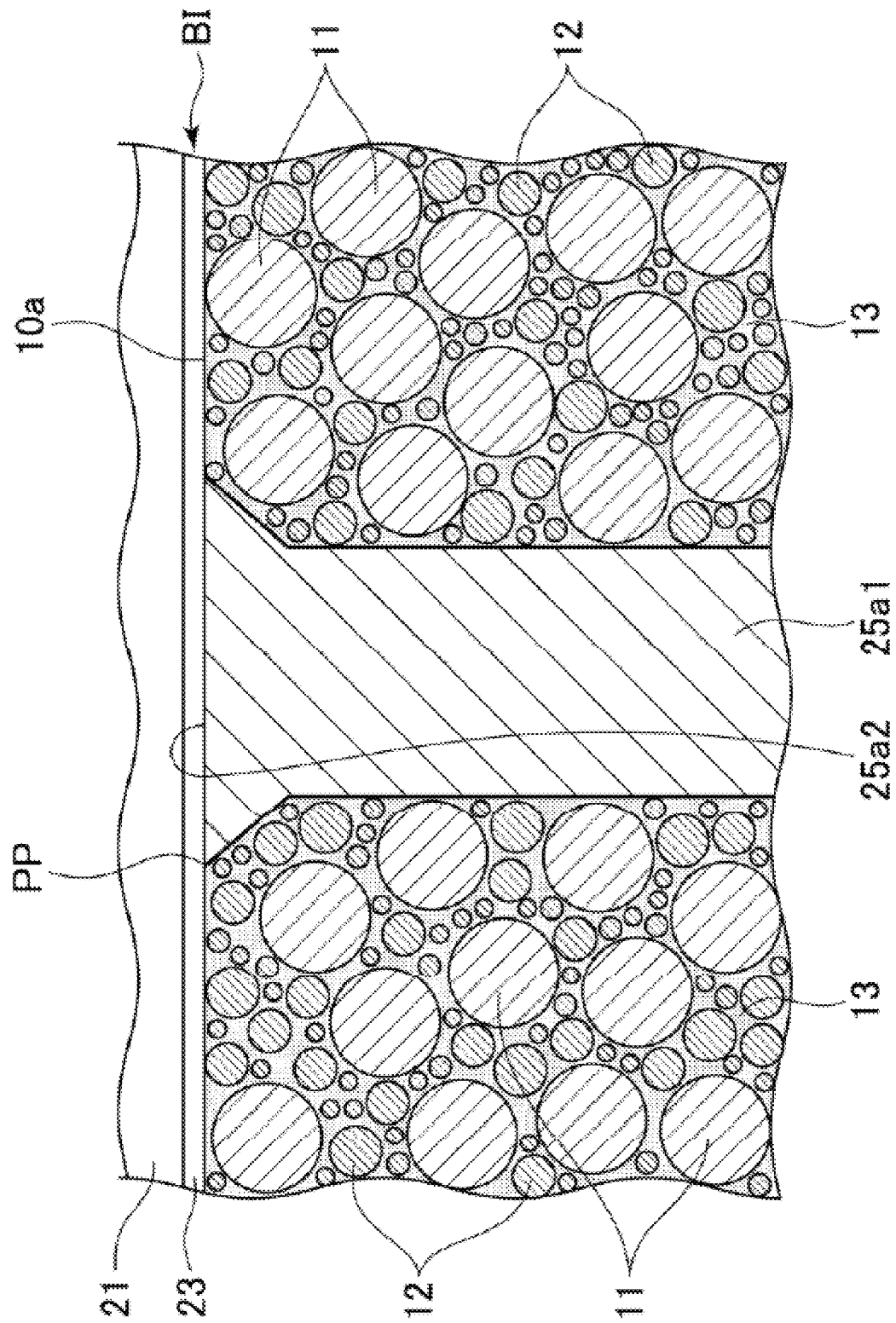
FIG. 3 is an enlarged sectional view showing, on an enlarged scale, a sectional surface around the joint between one end portion of a conductor and an external electrode in the coil component shown in FIG. 1.

FIG. 3 is an enlarged sectional view showing, on an enlarged scale, a sectional surface around the joint between one end portion of the conductor 25 and the external electrode 21 in the coil component 1 shown in FIG. 1. As shown in FIG. 3, the coil component 1 includes a metal film 23 interposed between the external electrode 21 and one end portion of the conductor 25 (the lead-out conductor 25a1). In other words, the external electrode 21 and one end portion of the conductor 25 are electrically connected to each other via the metal film 23. The coil component 1 further includes another metal film (not shown) interposed between the external electrode 22 and the other end portion of the conductor 25 (the lead-out conductor 25b1). The metal film 23 and the other metal film are, for example, sputtered films. In the embodiment shown, the metal film 23 and the other metal film have the same function, material, and shape. The following description on the metal film 23 also applies to the other metal film unless in specific cases. In addition, FIGS. 3 to 7B for description of the metal film 23 also apply to the other metal film.

The metal film 23 is made of, for example, a metal such as Ag, Au, Pd, Pt, Cu, Ni, Ti, and Ta or an alloy of these metals. Metals suitable for the metal film 23 are less apt to oxidation or ready to be reduced after oxidation. The metal film 23 is preferably made of a material having a low volume resistivity. The thickness of the metal film 23 is not particularly limited but may be, for example, 1 µm to 5 µm. The ionization tendency of the main ingredient of the metals contained in the metal film 23 is preferably smaller than that of the metal constituting the conductor 25. The phrase "the main ingredient of the metals contained in the metal film 23" refers to the metal ingredient that makes up more than a half of the metal species by weight percent among the metals contained in the metal film 23. When the metal film 23 contains one metal, this metal is the main ingredient. By way of one example, when the conductor 25 is made of Cu, the metal contained in the metal film 23 may be Ag.

At least a part of the metal film 23 and at least a part of one end portion of the conductor 25 (the end surface 25a2) are connected with each other by metallic bond. The phrase "at least a part of one end portion of the conductor 25" mentioned here refers to some region of the end surface 25a2. For example, the metal film 23 and the end portion 25a1 may be connected with each other by metallic bond at a peripheral portion PP of the end surface 25a2 (see FIG. 3). FIG. 3 shows an example in which the metal film 23 and the end portion 25a1 of the conductor 25 are connected with each other by metallic bond at the entirety of the end surface 25a2. In the example shown in FIG. 3, the region of the end surface 25a2 at which the metal film 23 and the end portion 25a1 are metal-bonded to each other includes the peripheral portion PP.

Figure 4:
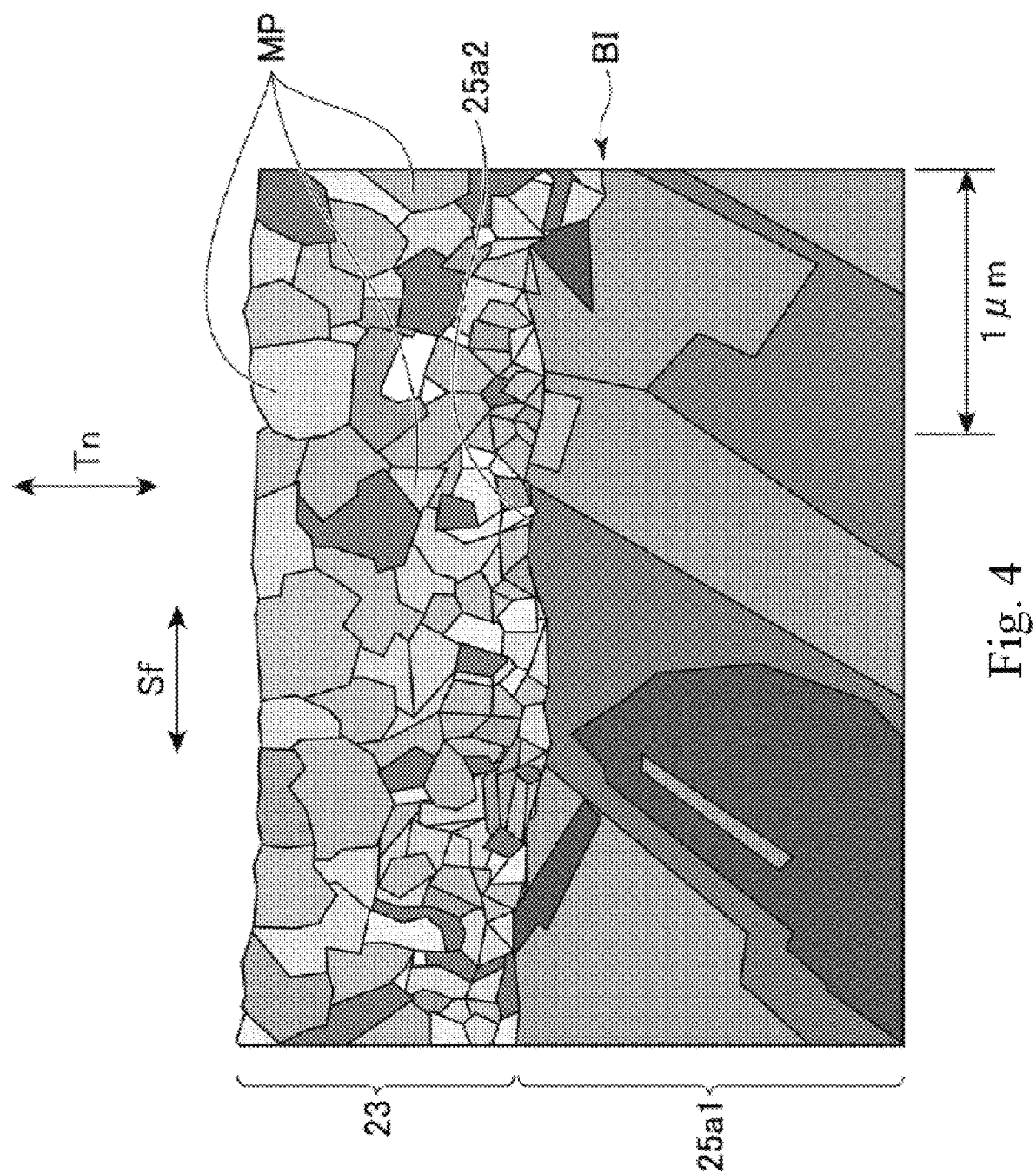
FIG. 4 is a schematic view showing an electron microscope image of a sectional surface of the joint between an end surface of the conductor and a metal film in the coil component.
Figure 5A:
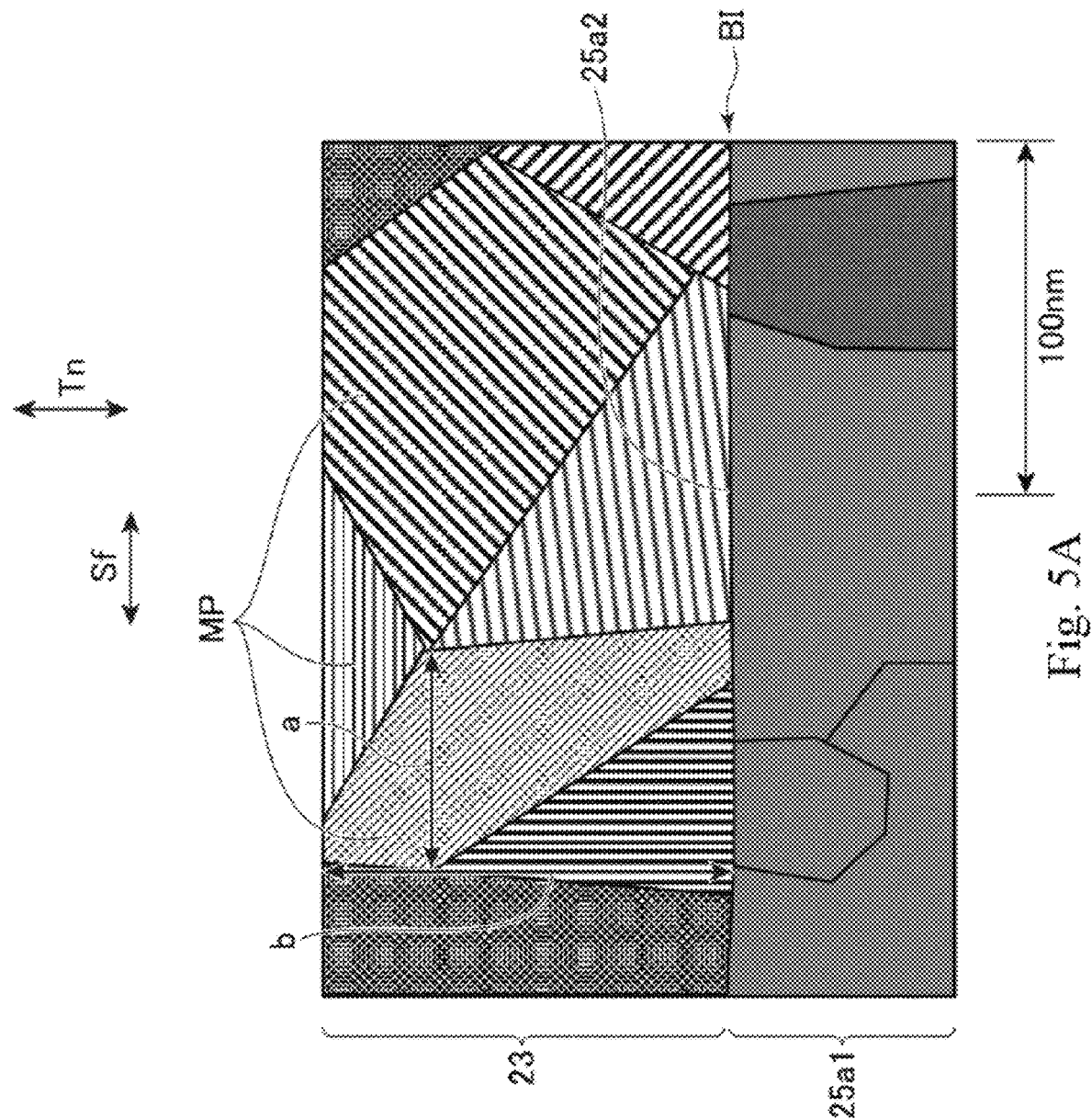
FIG. 5A is a schematic view of a transmission electron microscope image showing metal particles contained in the metal film of the coil component.
Figure 6A:
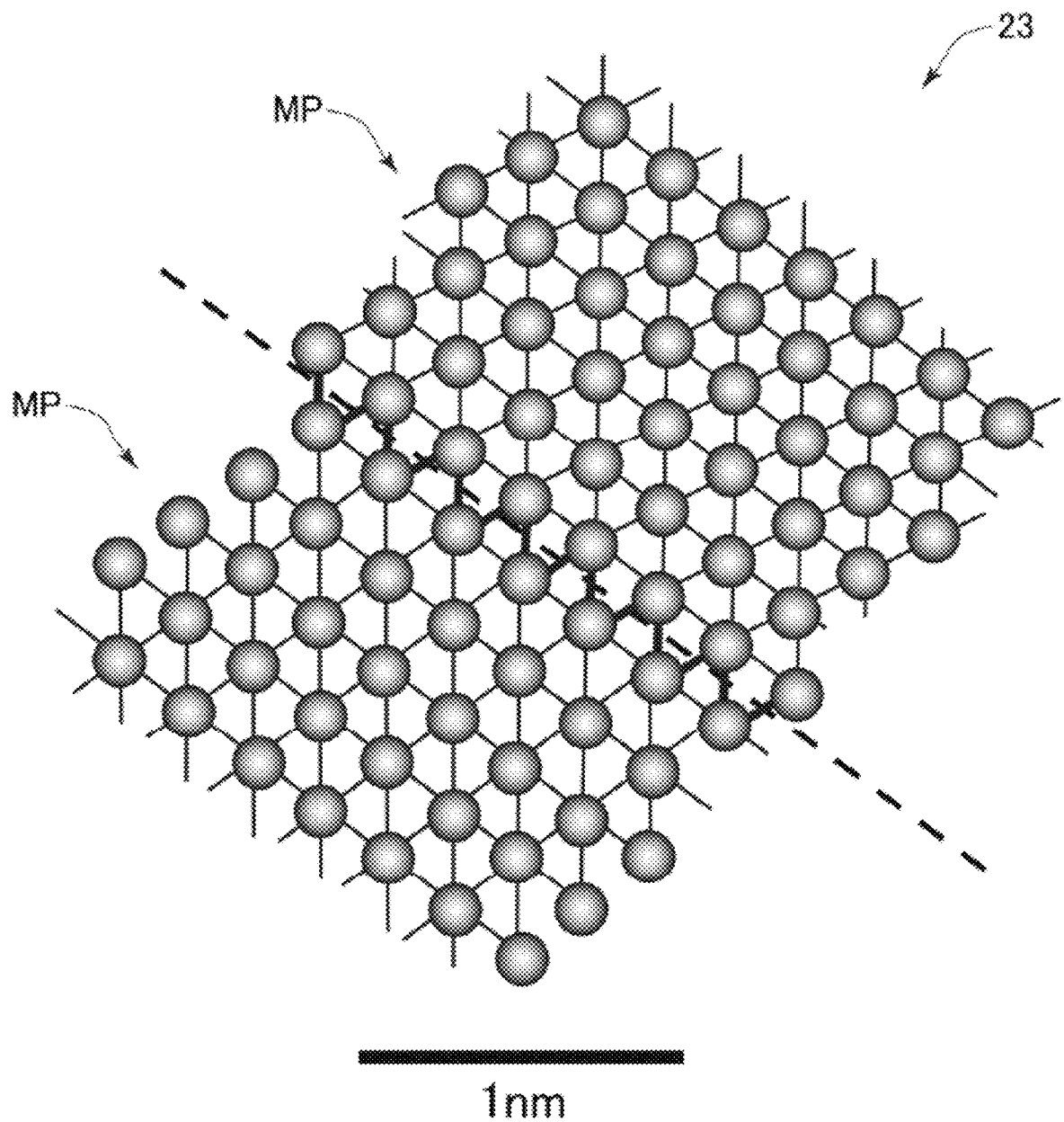
FIG. 6A schematically shows a grain boundary between metal particles in the metal film shown in FIG. 5A.

Next, with reference to FIGS. 4, 5A, and 6A, a detailed description is given of the metal film 23. FIG. 4 is a schematic view showing an electron microscope image of a sectional surface of the joint between the end surface 25a2 of the conductor 25 and the metal film 23 in the coil component 1. FIG. 5A is a schematic view of a transmission electron microscope image showing metal particles contained in the metal film 23 of the coil component 1. FIG. 6A schematically shows a grain boundary between metal particles in the metal film 23 shown in FIG. 5A.

As shown in FIG. 4, in the direction perpendicular to the boundary interface BI between the metal film 23 and the end portion 25a1 of the conductor 25 (that is, the thickness direction Tn of the metal film 23), the particle sizes of the metal particles MP positioned on the end portion 25a1 side are smaller than the particle sizes of the metal particles MP positioned on the external electrode 21 side. The boundary interface BI microscopically has a plurality of indentations, but the boundary interface BI is herein regarded as a flat surface extending in one direction so as to specify a direction relative to the boundary interface BI. By way of one example, the average particle size of the metal particles MP positioned on the end portion 25a1 side of the midpoint of the metal film 23 in the thickness direction Tn is 50 nm to 100 nm, and the average particle size of the metal particles MP positioned on the external electrode 21 side of the midpoint of the metal film 23 in the thickness direction Tn is 100 nm to 500 nm. Contrary to the embodiment shown, it is also possible that the particle sizes of the metal particles MP positioned on the end portion 25a1 side are larger than the particle sizes of the metal particles MP positioned on the external electrode 21 side.

As shown in FIG. 5A, the average of the aspect ratios of the metal particles MP contained in the metal film 23 is 0.8 to 1.2. An aspect ratio of a metal particle MP contained in the metal film 23 is β/α, where α is the dimension of the metal particle MP in the direction horizontal to the boundary interface BI (that is, the surface direction Sf), and β is the dimension of the metal particle MP in the direction perpendicular to the boundary interface BI (that is, the thickness direction Tn). The average of the aspect ratios of the metal particles MP may be an average of the aspect ratios of, for example, five, ten, or other plural number of metal particles MP. As shown in FIG. 6A, the metal particles MP contained in the metal film 23 are metal-bonded to each other. Therefore, the voids formed in the interface between the metal particles MP contained in the metal film 23 have a size of not more than five atoms included in the metal particles MP. In the embodiment shown, no impurity or void is present in the interface between the metal particles MP. In the interface between the metal particles MP, the atoms included in the metal particles MP are arranged periodically in a continuous manner.

Next, a description is given of a manufacturing method of the coil component 1 as an electronic component according to one embodiment of the invention. First, the conductor 25 formed of a metal material or the like and having a coil shape is placed into a mold, along with a mixed resin composition prepared by mixing and kneading particles including the first metal magnetic particles 11 and the second metal magnetic particles 12 with the binder 13 composed of a resin or the like. This is then compression molded such that the end surface 25a2 of the lead-out conductor 25a1 and the end surface 25b2 of the lead-out conductor 25b1 of the conductor 25 are exposed in the surface. The coil shape of the conductor 25 is not particularly limited. For example, the conductor 25 is made of a wire wound in a spiral shape, or it may be made of a planar coil instead of the wound wire. The conductor 25 may have an insulating coat. The resin in the molded product is cured to obtain the magnetic base body 10 having the conductor 25 embedded therein.

Next, the surface of the magnetic base body 10 in which the end surface 25a2 of the lead-out conductor 25a1 and the end surface 25b2 of the lead-out conductor 25b1 of the conductor 25 are exposed is smoothed to remove oxides. By way of an example, the surface of the magnetic base body 10 may be polished with an abrasive and then subjected to plasma etching. The particle size of the abrasive should preferably be smaller than that of the first metal magnetic particles 11. For example, when the average particle size of the first metal magnetic particles 11 is 30 μm, an abrasive having a particle size of 25 μm is selected. Any etching method, such as plasma etching, is available that can remove oxides from the surface of the magnetic base body.

Next, the metal film 23 is formed. One example of the method of forming the metal film 23 is sputter deposition, or in particular, high density sputter deposition. In high density sputter deposition, a large electric power is applied for a short period to form a dense film while preventing overheating of the sputtered film. The sample may be cooled during sputtering, such that a larger electric power can be applied to form more dense sputtered film. With the above metals used in this method, the metal film 23 can be formed efficiently at a high sputtering yield. The metal film formed by sputter deposition is herein referred to as a sputtered film. The metal film 23 may alternatively be formed by methods other than sputter deposition capable of metallic bond between the end surface 25a2 of the conductor 25 and the metal film 23.

In the metal film 23 formed by sputter deposition, the metal particles MP constituting the metal film 23 have a small particle size. This makes the metal film 23 dense, as shown in FIG. 4. By way of a specific example, the metal particles MP have an average particle size of 10 nm to 50 nm in the region from the boundary interface BI to the thickness of the metal film 23 of 200 nm, an average particle size of 50 nm to 150 nm in the region of the thickness of the metal film 23 from 200 nm to 500 nm, and an average particle size of 150 nm to 300 nm in the region of the thickness of the metal film 23 from 500 nm onward. This method makes it possible that the metal particles MP constituting the metal film 23 have an aspect ratio of, for example, 0.8 to 1.5 in the thickness direction of the metal film 23. More preferably, this method makes it possible that the metal particles MP constituting the metal film 23 have an aspect ratio of 0.8 to 1.2. Therefore, the metal film 23 can be a dense film in which the proportion (density) of the metal particles MP in the metal film 23 is 99% or larger. This proportion can be confirmed when it is observed under a transmission electron microscope (TEM) that the proportion of voids in a brightfield image at a magnification of 500,000 is less than 1%.

When sputter deposition is performed with a sputtering apparatus (not shown), the apparatus is set as follows. First, the component is set in the apparatus, and the apparatus is evacuated to a high vacuum to remove oxygen from the apparatus, Rare gases are ionized, and the film formation surface is cleaned by reverse sputtering. Then, a metal target (a metal for making the metal film 23) is sputtered. The metal atoms recoiling from the metal target are deposited on the mounting surface 10a of the component body with high energy. In this way, sputter deposition is capable of forming the metal film 23 containing less impurities and no oxides. Since the end surface 25a2 of the lead-out conductor 25a1 and the end surface 25b2 of the lead-out conductor 25b1 are exposed in the mounting surface 10a, the metal film 23 and the other metal film can be formed at the same time by this method. In addition, metal materials apt to oxidation can be used. In particular, when the ionization tendency of the metal of the metal target is smaller than that of the metal of the end surfaces 25a2, 25b2, the metal atoms recoiling from the metal target is less apt to oxidation than the metal of the end surface 25a2. Therefore, the metal film 23 containing no oxides can be formed.

Finally, the external electrodes 21, 22 are formed by a method such as sputtering. The coil component 1 is manufactured in this manner. The coil component 1 manufactured is mounted on the circuit board by soldering the external electrodes 21, 22 to the corresponding land portions of the circuit board.

Figure 5B:
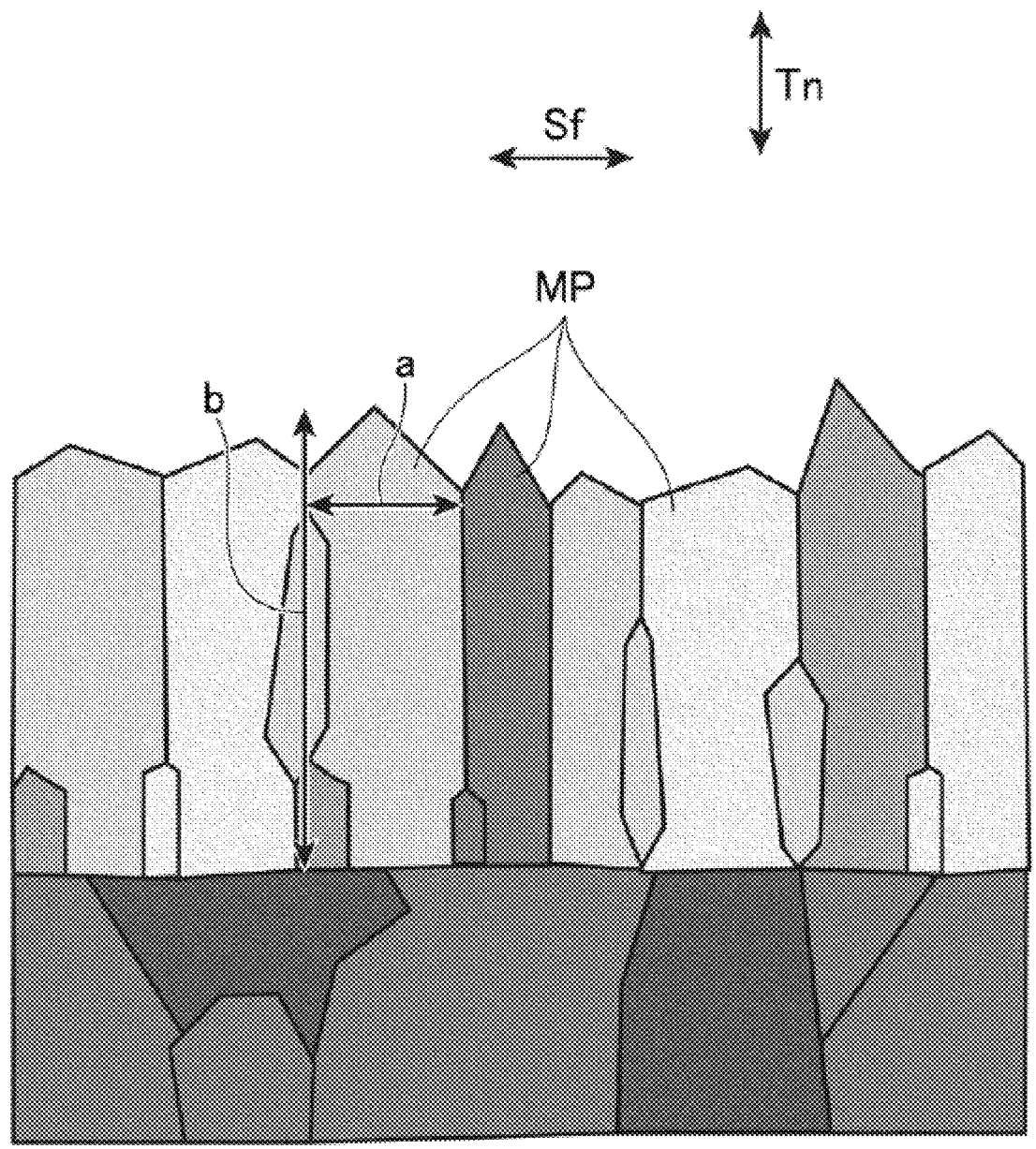
FIG. 5B is a schematic view of a transmission electron microscope image showing metal particles contained in a conventional metal film.
Figure 6B:
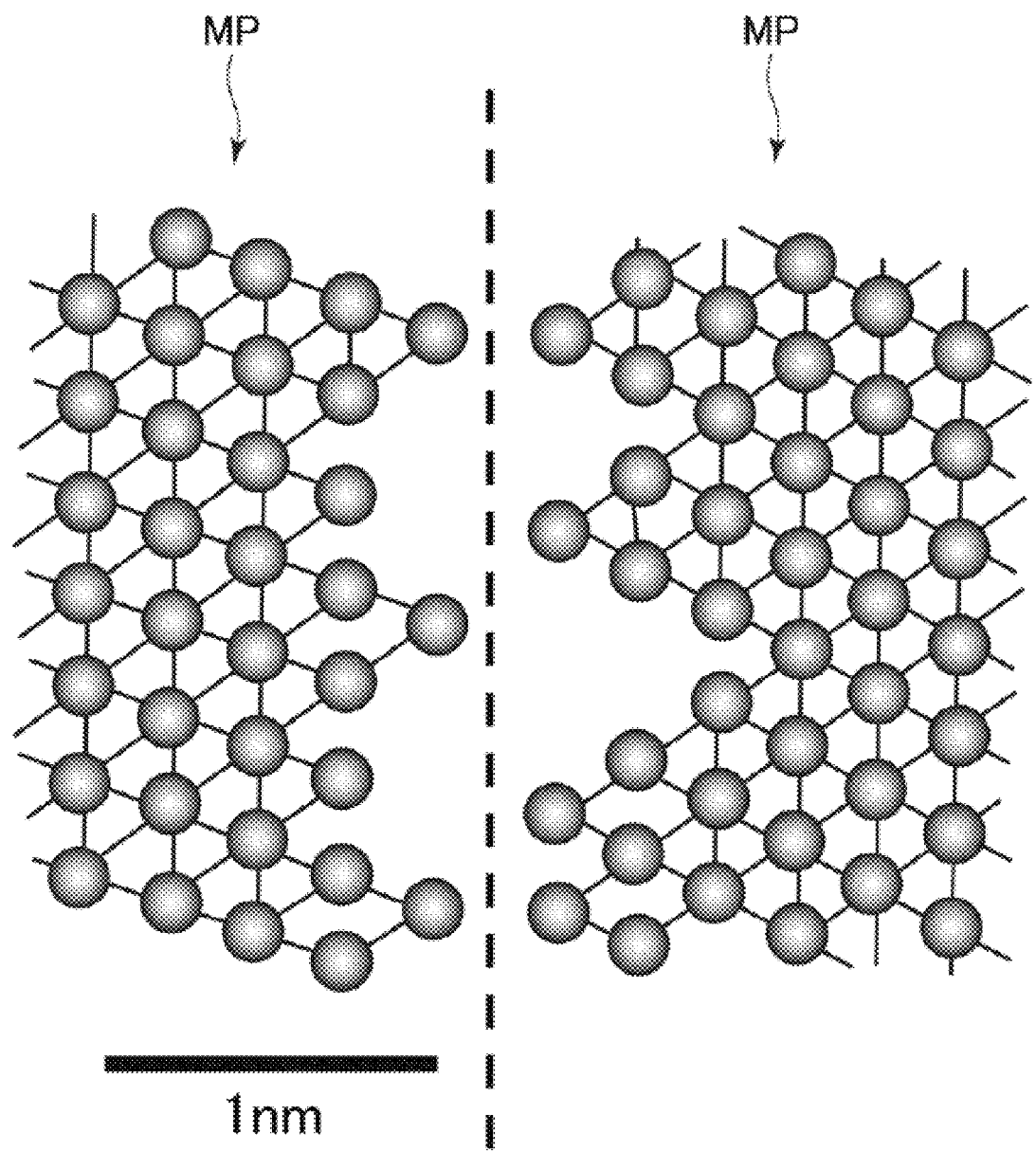
FIG. 6B schematically shows a grain boundary between metal particles in the conventional metal film shown in FIG. 5B.
Figure 7A:
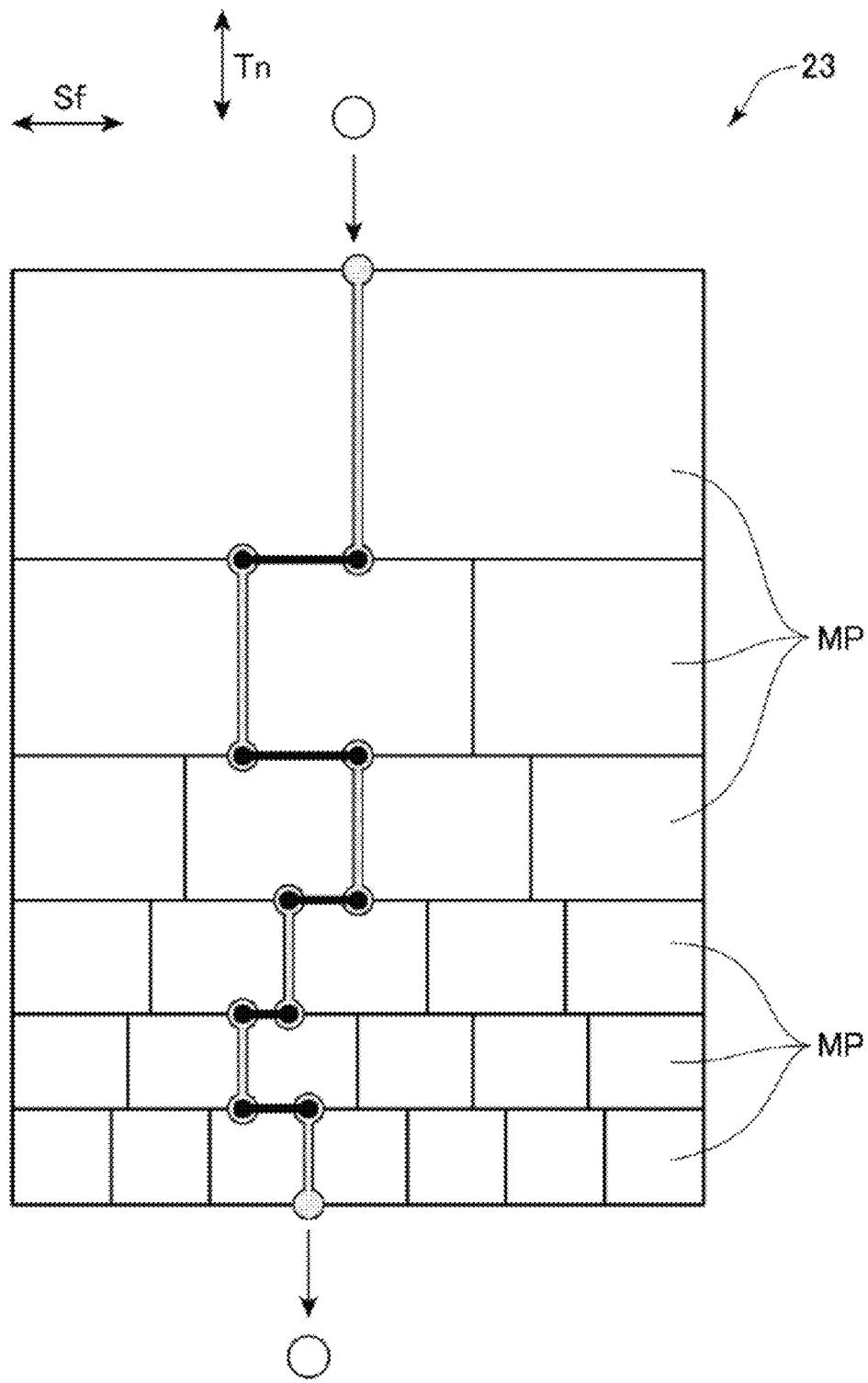
FIG. 7A schematically shows a moving path of atoms in the metal film shown in FIG. 5A.
Figure 7B:
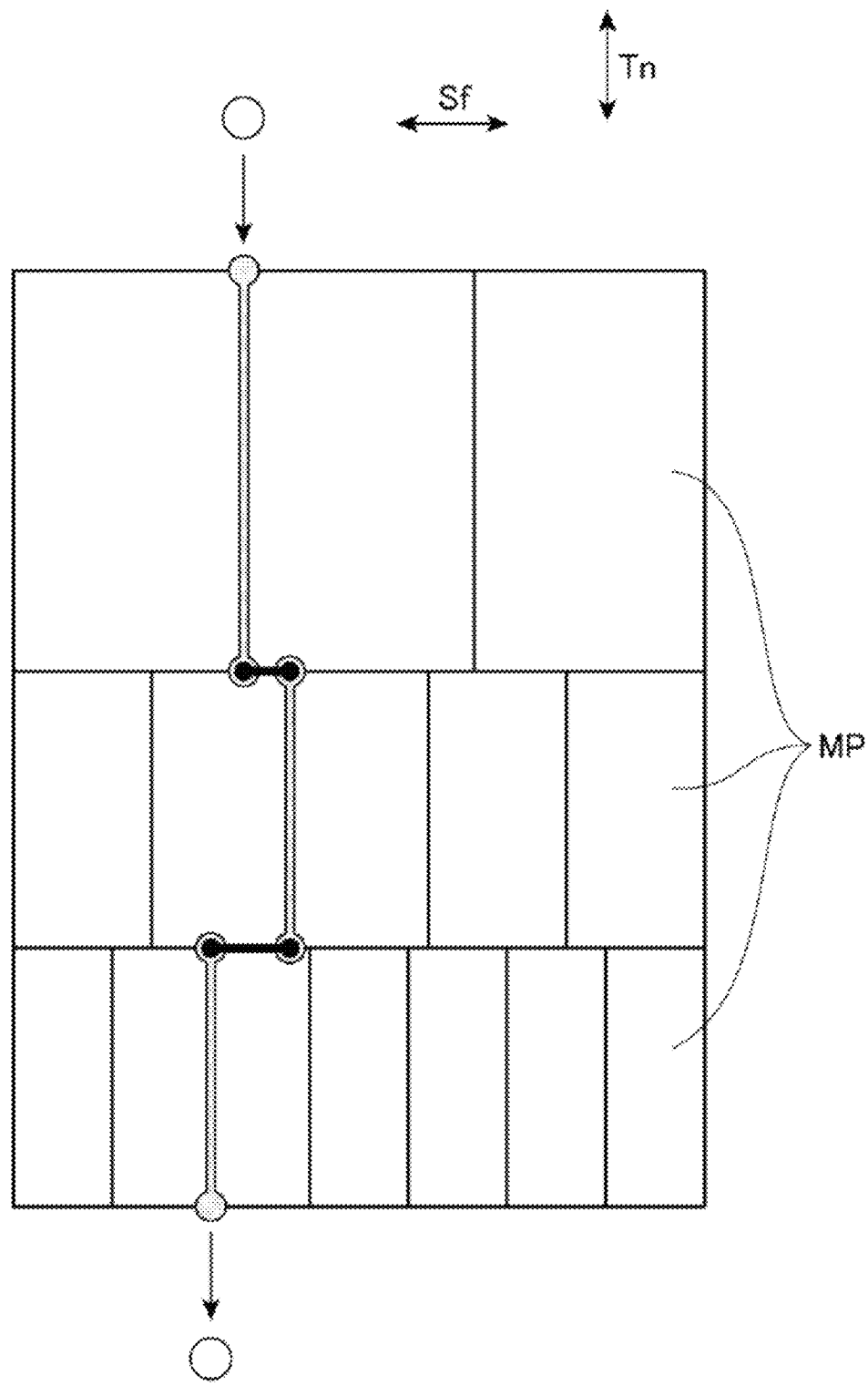
FIG. 7B schematically shows a moving path of atoms in the conventional metal film shown in FIG. 5B.

Advantageous effects of the coil component 1 according to the embodiment will be hereinafter described with reference to FIGS. 5A to 7B. FIG. 5B is a schematic view of a transmission electron microscope image showing metal particles contained in a conventional metal film. FIG. 6B schematically shows a grain boundary between metal particles in the conventional metal film shown in FIG. 5B. FIG. 7A schematically shows a moving path of atoms in the metal film 23 shown in FIG. 5A. FIG. 7B schematically shows a moving path of atoms in the conventional metal film shown in FIG. 5B.

As shown in FIG. 5A, the coil component 1 according to one embodiment of the present invention includes the metal film 23. The metal film 23 contains the metal particles MP configured such that the average of β/α is 0.8 to 1.2, where for each of the metal particles MP, α is the dimension of the metal particle MP in the direction horizontal to the boundary interface BI between one end portion 25a1 of the conductor 25 and the metal film 23, and β is the dimension of the metal particle MP in the direction perpendicular to the boundary interface BI. As shown in FIG. 5B, the average of the aspect ratios of metal particles contained in the conventional metal film is larger than 2. Therefore, in the conventional metal film, it is probable that an impurity atom moving in the direction perpendicular to the boundary interface BI (that is, the thickness direction Tn) collides with a metal particle contained in the metal film (see FIG. 7B). An example of the impurity is tin included in the solder for mounting the coil component 1 on the circuit board. By contrast, in the coil component 1 according to the embodiment of the invention, the average of β/α is 0.8 to 1.2, and therefore, an impurity atom moving in the direction perpendicular to the boundary interface probably collides with a metal particle contained in the metal film, leading to a smaller mean free path. As a result, the impurity atom moves in the direction Sf more frequently, and thus it needs to move a larger distance to pass through the metal film 23 (see FIGS. 7A and 7B). By way of an example, assuming that the diffusion velocity in the metal film 23 is 1, the diffusion velocity in the conventional metal film is about $10^3$ to $10^7$. Accordingly, the migration between the conductor 25 and the external electrode 21 can be inhibited.

In addition, as shown in FIG. 6A, the voids formed in the interface between the metal particles MP contained in the metal film 23 may have a size of not more than five atoms included in the metal particles MP. As shown in FIG. 6B, the conventional metal film includes distinct voids in the interface between the metal particles, resulting in discontinuity in the lattice arrangement. Therefore, an impurity atom moving in the metal film readily passes through the interface between the metal particles. By contrast, in the metal film 23 of the coil component 1 according to one embodiment of the present invention, the voids in the interface between the metal particles MP have a size of not more than five atoms, and therefore, an impurity atom is less likely to pass through the interface between the metal particles. Accordingly, the migration between the conductor 25 and the external electrode 21 can be inhibited.

Figure 8:
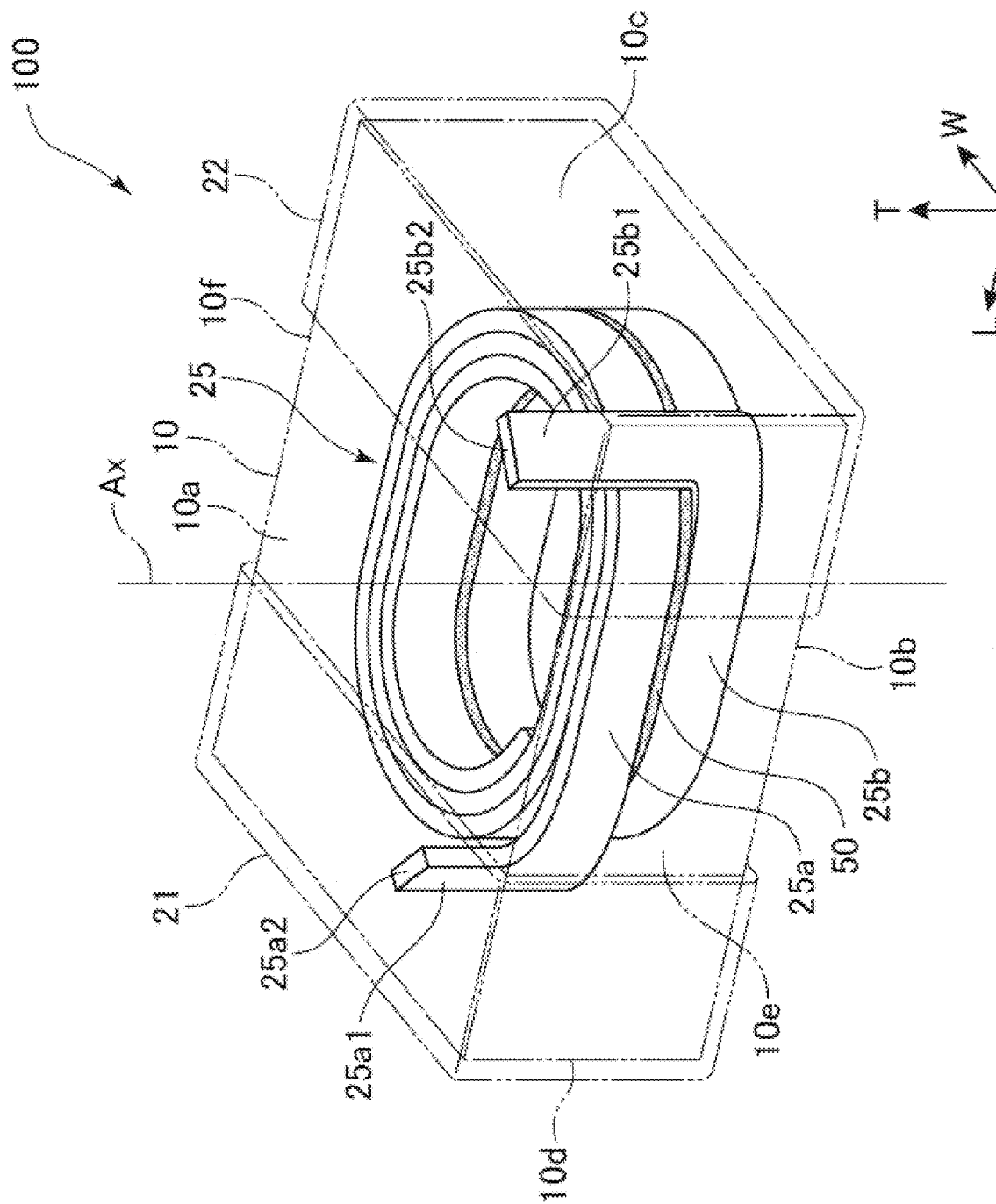
FIG. 8 is a perspective view schematically showing a coil component according to another embodiment of the present invention.

Next, a description is given of a coil component 100 according to another embodiment of the present invention with reference to FIG. 8. FIG. 8 is a perspective view schematically showing the coil component 100. As shown, similarly to the coil component 1, the coil component 100 includes a base body 10, a coil conductor 25 provided in the base body 10, an external electrode 21 disposed on a surface of the base body 10, and an external electrode 22 disposed on the surface of the base body 10 at a position spaced from the external electrode 21. The coil component 100 is different from the coil component 1 in that it includes an insulating plate 50 and two conductors 25. The insulating plate is provided in the base body 10, and the two conductors 25 are provided on the top-side surface and the bottom-side surface of the insulating plate 50, respectively.

Similarly to the coil component 1, the coil component 100 includes the metal plate 23 positioned between the external electrode 21 and one end portion of the conductor 25, and the metal particles MP contained in the metal film 23 have an aspect ratio of 0.8 to 1.2. Accordingly, for the same reason as with the coil component 1, the migration of an impurity atom between the conductor 25 and the external electrode 21 can be inhibited.

Figure 9:
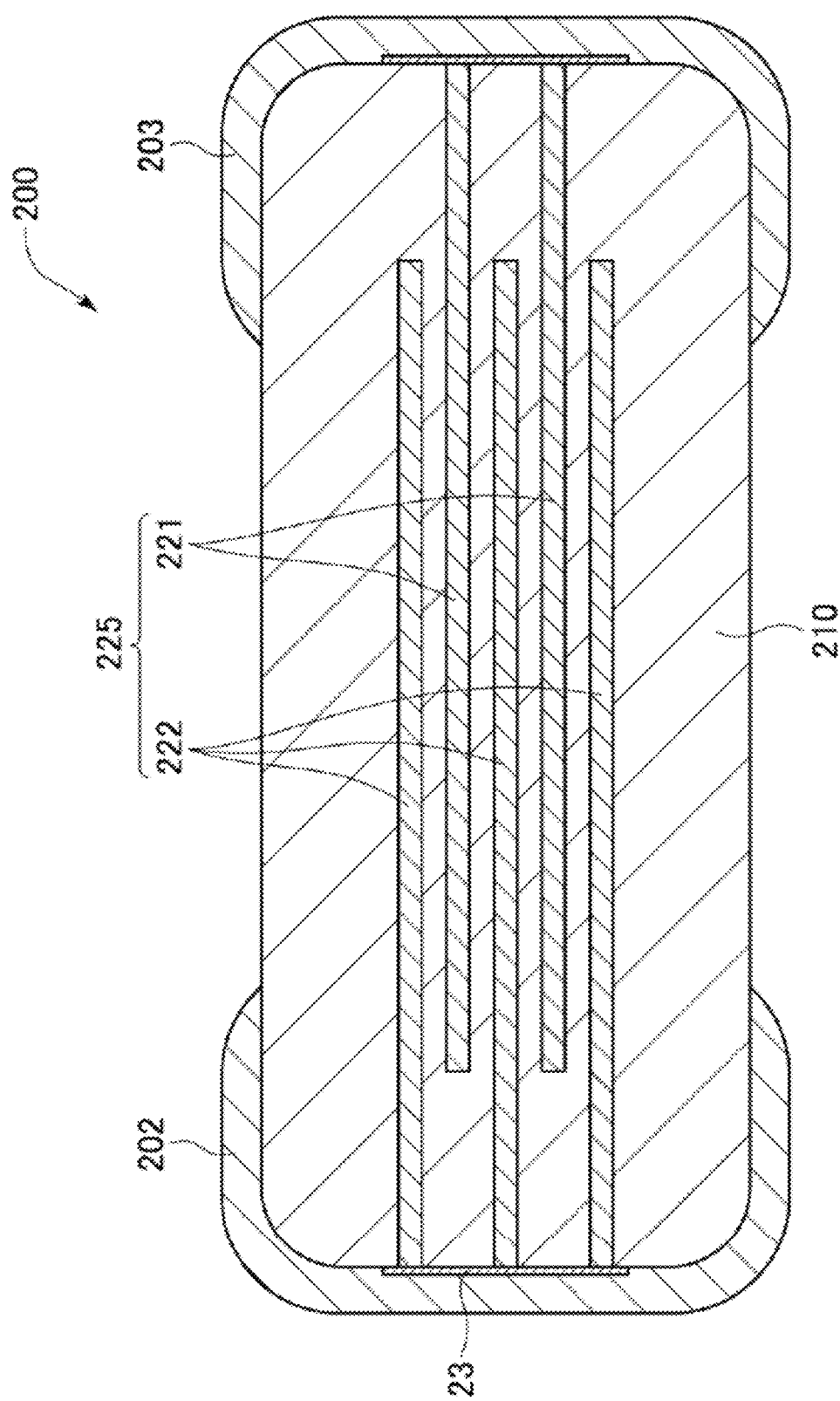
FIG. 9 is a sectional view schematically showing a capacitor as an electronic component according to the other embodiment of the present invention.

The electronic component according to the present invention is not limited to a coil component but may be a capacitor, for example. FIG. 9 is a sectional view schematically showing a capacitor 200 as an electronic component according to the other embodiment of the present invention. As shown in FIG. 9, the capacitor 200 includes a base body 210, a conductor 225 provided in the base body 210, and external electrodes 202, 203 disposed on the periphery of the base body 210. In the embodiment shown in FIG. 9, the capacitor 200 is what is called a MLCC (multilayer ceramic capacitor), and the conductor 225 includes a plurality of first electrode layers 221 and a plurality of second electrode layers 222. The first electrode layers 221 and the second electrode layers 222 alternate, and the base material 210 mediates between these layers. The portions of the base material 210 mediating between the first electrode layers 221 and the second electrode layers 222 serve as a dielectric. Similarly to the coil component 1, the capacitor 200 includes the metal film 23 and the other metal film. The metal film 23 is positioned between the external electrode 202 and the conductor 225, and the other metal film is positioned between the external electrode 203 and the conductor 225.

Similarly to the coil component 1, the capacitor 200 includes the metal plate 23 positioned between the conductor 225 and the external electrode 202 and the other metal plate positioned between the conductor 225 and the external electrode 203, and the metal particles MP contained in the metal film 23 and the other metal film have an aspect ratio of 0.8 to 1.2. Accordingly, for the same reason as with the coil component 1, the migration of an impurity atom between the conductor 225 and the external electrode 202 can be inhibited.

The dimensions, materials, and arrangements of the constituent elements described for the above various embodiments are not limited to those explicitly described for the embodiments, and these constituent elements can be modified to have any dimensions, materials, and arrangements within the scope of the present invention. Furthermore, constituent elements not explicitly described herein can also be added to the above-described embodiments, and it is also possible to omit some of the constituent elements described for the embodiments.

For example, each of the coil component 1 and the coil component 100 may further include oxide films positioned between one end portion 25$a$1 of the conductor 25 and the metal film 23 and between the other end portion 25$b$1 of the conductor 25 and the other metal film. The oxide films have such a thickness that a tunnel current or a Schottky current can pass through the oxide films. By way of an example, the thickness of the oxide films may be 200 nm or smaller. Since the diffusion velocity in the oxide films is lower than the diffusion velocity in the external electrodes 21, 22, this configuration makes it possible to further inhibit the migration of an impurity atom between the conductor 25 and the external electrodes 21, 22.

What is claimed is:

1. An electronic component, comprising:
   a base body;
   a conductor provided inside or outside the base body, the conductor being mainly formed of Cu;
   a first external electrode electrically connected to the conductor;
   a second external electrode electrically connected to the conductor; and
   a metal film positioned between the conductor and the first external electrode, the metal film being mainly formed of Ag,
   wherein the metal film contains metal particles configured such that an average of $\beta/\alpha$ is 0.8 to 1.2, where for each of the metal particles, $\alpha$ is a dimension of the metal particle in a direction horizontal to a boundary interface between the conductor and the metal film, and $\beta$ is a dimension of the metal particle in a direction perpendicular to the boundary interface.

2. The electronic component of claim 1, wherein at least a part of the conductor and at least a part of the metal film are connected with each other by metallic bond.

3. The electronic component of claim 1, further comprising an oxide film positioned between the conductor and the metal film, wherein the oxide film has a thickness of 200 nm or smaller.

4. The electronic component of claim 1, wherein in a direction perpendicular to the boundary interface, particle sizes of the metal particles positioned on a conductor side are smaller than particle sizes of the metal particles positioned on a first external electrode side.

5. The electronic component of claim 1, wherein the metal film is a sputtered film.

6. The electronic component of claim 1, wherein a void formed in an interface between the metal particles contained in the metal film has a size of not more than five atoms included in the metal particles.

7. The electronic component of claim 1, wherein the metal film further contains Cu or an alloy including at least one of Cu and Ag.

8. The electronic component of claim 1, further comprising another metal film positioned between the conductor and the second external electrode,
   wherein the other metal film contains metal particles configured such that an average of $\beta/\alpha$ is 0.8 to 1.2, where for each of the metal particles, $\alpha$ is a dimension of the metal particle in a direction horizontal to another boundary interface between the conductor and the other metal film, and $\beta$ is a dimension of the metal particle in a direction perpendicular to the other boundary interface.

9. The electronic component of claim 8, wherein at least a part of the conductor and at least a part of the other metal film are connected with each other by metallic bond.

10. The electronic component of claim 8, further comprising another oxide film positioned between the conductor and the other metal film, wherein the other oxide film has a thickness of 200 nm or smaller.

11. The electronic component of claim 8, wherein in a direction perpendicular to the other boundary interface, particle sizes of the metal particles positioned on a conductor side are smaller than particle sizes of the metal particles positioned on a second external electrode side.

12. The electronic component of claim 8, wherein the other metal film is a sputtered film.

13. The electronic component of claim 8, wherein a void formed in an interface between the metal particles contained in the other metal film has a size of not more than five atoms included in the metal particles.

14. The electronic component of claim 8, wherein the other metal film contains Cu, Ag, or an alloy including at least one of Cu and Ag.

15. The electronic component of claim 1, wherein an ionization tendency of a main ingredient of a metal contained in the first external electrode and the second external electrode is smaller than that of a main ingredient of a metal contained in the conductor.

16. The electronic component of claim 1, wherein the conductor includes a portion wound around a coil axis.

17. A circuit board comprising the electronic component of claim 1.

18. An electronic device comprising the circuit board of claim 17.

* * * * *